(12) United States Patent
Bhattacharyya

(10) Patent No.: US 7,851,850 B2
(45) Date of Patent: Dec. 14, 2010

(54) BAND ENGINEERED NANO-CRYSTAL NON-VOLATILE MEMORY DEVICE UTILIZING ENHANCED GATE INJECTION

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/623,895

(22) Filed: Nov. 23, 2009

(65) Prior Publication Data

US 2010/0072537 A1    Mar. 25, 2010

Related U.S. Application Data

(62) Division of application No. 11/217,030, filed on Aug. 31, 2005, now Pat. No. 7,629,641.

(51) Int. Cl.
*H01L 29/792* (2006.01)

(52) U.S. Cl. .................. 257/325; 257/324; 257/317; 257/E29.309; 365/185.01; 365/185.05

(58) Field of Classification Search .............. 257/325, 257/324, 317, E29.309; 365/185.01, 185.05
See application file for complete search history.

(56) References Cited

U.S. PATENT DOCUMENTS

| | | | |
|---|---|---|---|
| 4,870,470 A | 9/1989 | Bass, Jr. et al. | |
| 5,886,368 A | 3/1999 | Forbes et al. | |
| 6,121,654 A * | 9/2000 | Likharev | 257/315 |
| 6,514,828 B2 | 2/2003 | Ahn et al. | |
| 6,586,797 B2 | 7/2003 | Forbes et al. | |
| 6,642,573 B1 | 11/2003 | Halliyal et al. | |
| 6,664,589 B2 | 12/2003 | Forbes et al. | |
| 6,713,810 B1 | 3/2004 | Bhattacharyya | |
| 6,743,681 B2 | 6/2004 | Bhattacharyya | |
| 6,754,108 B2 | 6/2004 | Forbes | |
| 6,759,713 B2 | 7/2004 | Bhattacharyya | |
| 6,768,156 B1 | 7/2004 | Bhattacharyya | |
| 6,778,441 B2 | 8/2004 | Forbes et al. | |
| 6,784,480 B2 | 8/2004 | Bhattacharyya | |

(Continued)

OTHER PUBLICATIONS

S. Okhomin, et al.; A Soi Capacitor-Less It DRAM Concept; IEEE International SOI Conference, Oct. 2001; pp. 153-154.

(Continued)

*Primary Examiner*—Thinh T Nguyen
(74) *Attorney, Agent, or Firm*—Leffert Jay & Polglaze, P.A.

(57) ABSTRACT

Non-volatile memory devices and arrays are described that utilize reverse mode non-volatile memory cells that have band engineered gate-stacks and nano-crystal charge trapping in EEPROM and block erasable memory devices, such as Flash memory devices. Embodiments of the present invention allow a reverse mode gate-insulator stack memory cell that utilizes the control gate for programming and erasure through a band engineered crested tunnel barrier. Charge retention is enhanced by utilization of high work function nano-crystals in a non-conductive trapping layer and a high K dielectric charge blocking layer. The band-gap engineered gate-stack with symmetric or asymmetric crested barrier tunnel layers of the non-volatile memory cells of embodiments of the present invention allow for low voltage tunneling programming and erase with electrons and holes, while maintaining high charge blocking barriers and deep carrier trapping sites for good charge retention.

23 Claims, 8 Drawing Sheets

U.S. PATENT DOCUMENTS

| | | | |
|---|---|---|---|
| 6,849,464 | B2 | 2/2005 | Drewes |
| 6,864,139 | B2 | 3/2005 | Forbes |
| 6,888,200 | B2 | 5/2005 | Bhattacharyya |
| 6,900,455 | B2 | 5/2005 | Drewes |
| 6,917,078 | B2 | 7/2005 | Bhattacharyya |
| 6,933,572 | B2 | 8/2005 | Bhattacharyya |
| 7,012,297 | B2 | 3/2006 | Bhattacharyya |
| 7,042,052 | B2 | 5/2006 | Bhattacharyya |
| 2003/0042527 | A1 | 3/2003 | Forbes et al. |
| 2003/0042532 | A1 | 3/2003 | Forbes |
| 2003/0042534 | A1 | 3/2003 | Bhattacharyya |
| 2003/0043632 | A1 | 3/2003 | Forbes |
| 2003/0043633 | A1 | 3/2003 | Forbes et al. |
| 2003/0043637 | A1 | 3/2003 | Forbes et al. |
| 2003/0045082 | A1 | 3/2003 | Eldridge et al. |
| 2003/0048666 | A1 | 3/2003 | Eldridge et al. |
| 2003/0089942 | A1 | 5/2003 | Bhattacharyya |
| 2003/0151948 | A1 | 8/2003 | Bhattacharyya |
| 2003/0235064 | A1 | 12/2003 | Batra et al. |
| 2005/0001232 | A1 | 1/2005 | Bhattacharyya |
| 2006/0084214 | A1 | 4/2006 | Bhattacharyya |
| 2006/0110870 | A1 | 5/2006 | Bhattacharyya |
| 2006/0192240 | A1 | 8/2006 | Bhattacharyya |
| 2006/0192243 | A1 | 8/2006 | Bhattacharyya |
| 2006/0258090 | A1 | 11/2006 | Bhattacharyya et al. |
| 2007/0045706 | A1 | 3/2007 | Bhattacharyya et al. |

OTHER PUBLICATIONS

T. Ohsawa et al.; Memory Design Using One Transistor Gain Cell on SOI; IEEE International Solid State Circuit Conference; 2002; pp. 152-153 and p. 454.

P. Dimitrakis et al.; Silicon Nanocrystal Memory Devices Obtained by Ultra-Low-Energy Ion-Beam Synthesis; International Solid State Electronics, No. 48; 2004; pp. 1511-1517.

A. Bhattacharyya; Physical and Electrical Characteristics of LPCVD Silicon Rich Nitride; 1669th Fall Meeting of the Electrochemical Society; 1984, p. 467c, 469c.

M. Koyanagi et al.; Metal Nano-Dot Memory for High-Density Non-Volatile Memory Application; IEEE SNVMW; 2004; 0-7803-8511-X/04.

M. Kanoun et al.; Electrical Study of Ge-Nanocrystal-Based Metal-Oxide-Semiconductor Structures for $p$-type Nonvolatile Memory Applications; Applied Physics Letters, vol. 84 No. 25; 2004; pp. 5079-5081.

C.M. Compagnoni et al.; Study of Data Retention for Nanocrystal Flash Memories; IEEE 41st Annual Intl. Reliability Physics Symposium; 2003; pp. 506-512.

D. Zhao et al.; Simulation of Hetero-Nanocrystal Floating Gate Flash Memory; IEDM; 2004; pp. 1-3.

Y.Q. Wang et al.; Formation of Ge Nanocrystals in HfAlO high-$k$ Dielectric and Application in Memory Device; Applied Physics Letters; vol. 84 No. 26; 2004; pp. 5407-5409.

C. Gerardi et al.; Fast and Low Voltage Program / Erase in Nanocrystal Memories: Impact of Control Dielectric Optimization; Non Volatile Semiconductor Memory Workshop (NVSMW); 2004; p. 71.

B. Govoreanu et al.; a Figure of Merit for Flash Memory Multi-Layer Tunnel Dielectrics; Simulation of Semiconductor Processes and Devices; 2001; pp. 270-273.

C.M. Compagnoni et al.; Program/Erase Dynamics and Channel Conduction in Nanocrystal Memories; IEDM; 2003; pp. 22.4.1-22.4.4.

R. Ohba et al.; Impact of Stoichiometry Control in Double Junction Memory on Future Scaling; IEDM; 2004; pp. 36.7.1-36.7.4.

S. Lombardo et al.; Distribution of the Threshold Voltage Window in Nanocrystal Memories with Si Dots Formed by Chemical Vapor Deposition: Effect of Partial Self-Ordering; Non Volatile Semiconductor Memory Workshop (NVSMW); 2004; p. 69.

R. Gupta et al.; Formation of SiGe Nanocrystals in $HfO_2$ Using in situ Chemical Vapor Deposition for Memory Applications; Applied Physics Letters, vol. 84 No. 21; 2004; pp. 4331-4333.

S. Tiwari et al.; Volatile and Non-Volatile Memories in Silicon with Nano-Crystal Storage; IEDM; 1995; pp. 20.4.1-20.4.4.

J.H. Chen et al.; Nonvolatile Flash Memory Device Using Ge Nano-Crystals Embedded in HfAlO High-k Dielectric; Non-Volatile Memory Workshop; 2005; p. 1124.

C. Lee et al.; Operational and Reliability Comparison of Discrete-Storage Nonvolatile Memories: Advantages of Single and Double-Layer Metal Nanocrystals; IEDM; 2003; pp. 22.6.1-22.6.4.

Y. Zhang et al.; Flash Memory Cell with $LaAlO_3$ (K=27.5) as Tunneling Dielectrics for Beyond Sub-50 nm Technology; Non-volatile Memory Workshop; 2004; pp. 1-2.

J.J. Lee et al.; Dielectric Engineering in Nanocrystal Memory Devices for Improved Programming Dynamics; IEEE 43rd Annual Reliability Physics Symposium; 2005; pp. 668-669.

J.J. Lee et al.; Novel Nonvolatile Memory Device Using Metal Nanocrystals Embedded in High-K for Improved Data Retention; Nonvolatile Workshop; 2004; pp. 11.1-11.2.

B. Govoreanu et al.; Variot: A Novel Multilayer Tunnel Barrier Concept for Low-Voltage Nonvolatile Memory Devices; IEEE Electron Device Letters, vol. 24 No. 2; 2003; pp. 99-101.

K.K. Likharev; Riding the Crest of a New Wave in Memory; Circuits and Devices; Jul. 2000; pp. 16-21.

J. Willer et al.; 110nm NROM Technology for Code and Data Flash Products; Symposium on VLSI Technology Digest of Technical Papers; 2004; pp. 76-77.

* cited by examiner

US 7,851,850 B2

BAND ENGINEERED NANO-CRYSTAL NON-VOLATILE MEMORY DEVICE UTILIZING ENHANCED GATE INJECTION

RELATED APPLICATION

This application is a divisional of U.S. application Ser. No. 11/217,030, titled "BAND ENGINEERED NANO-CRYSTAL NON-VOLATILE MEMORY DEVICE UTILIZING ENHANCED GATE INJECTION," filed Aug. 31, 2005 now U.S. Pat. No. 1,629,641, (allowed), which is commonly assigned and incorporated in its entirety herein by reference.

FIELD

The present invention relates generally to integrated circuits and in particular the present invention relates to non-volatile memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost. Computers almost always contain a small amount of ROM that holds instructions for starting up the computer.

EEPROM (electrically erasable programmable read-only memory) and Flash memories are special types of non-voF31Flatile ROMs that can be written and erased. A Flash memory is a type of EEPROM that is typically erased and reprogrammed in blocks instead of a single bit or one byte (8 or 9 bits) at a time. Flash and EEPROM memories may use floating gate technology or trapping technology non-volatile memory cells. Floating gate cells include source and drain regions that are laterally spaced apart to form an intermediate channel region. The source and drain regions are typically formed in a common horizontal plane of a silicon substrate. The floating gate, generally made of doped polysilicon, is disposed over the channel region and is electrically isolated from the other cell elements by oxide. The non-volatile memory function for the floating gate technology is created by the absence or presence of charge stored on the isolated floating gate. In floating node/embedded trap non-volatile memory cells, the stored charge is "trapped" and stored in a non-conductive trapping layer. One example of this trapping technology that functions as a non-volatile memory is the silicon-oxide-nitride-oxide-silicon (SONOS) architecture. In the SONOS architecture, the nitride trap layer can capture and store electrons or holes in order to act as a non-volatile memory.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

A problem in Flash/EEPROM floating gate and SONOS memory cell arrays is that voltage scalability affects the minimum cell size, and consequently the overall memory density of any resulting array. Both SONOS and floating gate Flash/EEPROM memories consume relatively high power compared to other memory technologies, requiring external or on-chip high voltage/current supplies for programming and erase operations. Due to the high programming voltage requirement, neighboring cells must be separated sufficiently apart (significantly greater than the minimum feature size) so as not to be disturbed by the capacitive coupling effect during programming of the active cell. This problem is more severe with scaling of the feature size capability, affecting cell density. In addition, the high programming/erase voltages diminish device endurance and retention by damaging the materials of the memory cell and generating flaws. As integrated circuit processing techniques improve, manufacturers try to reduce the feature sizes of the devices produced and thus increase the density of the IC circuits and memory arrays. Additionally, with progressive scaling of feature size, fundamental device leakage issues such as short-channel effects and gate dielectric leakage need to be contained in order to take advantage of scaling.

For the reasons stated above, and for other reasons stated below which will become apparent to those skilled in the art upon reading and understanding the present specification, there is a need in the art for low power scalable non-volatile memory cell devices.

DETAILED DESCRIPTION

Figure 2:
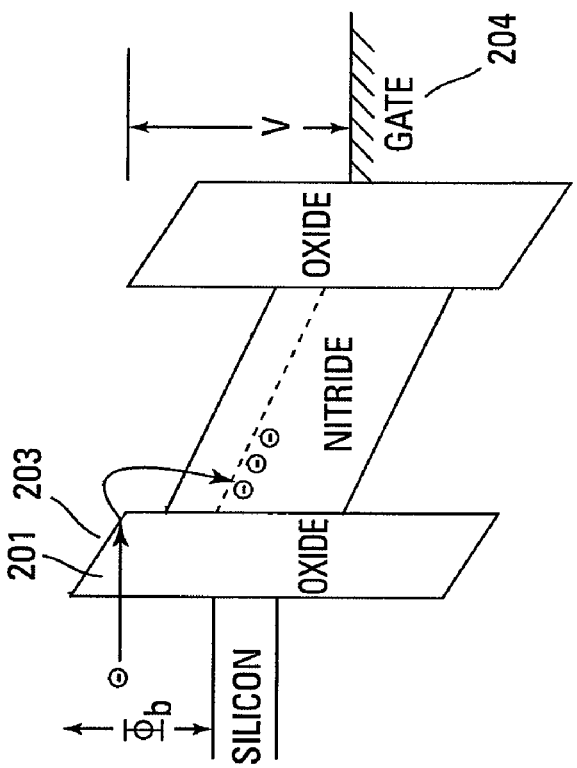
FIG. 2 shows an energy band diagram of the SONOS structure of FIG. 1 under a bias condition.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including bulk silicon, silicon-on-sapphire (SOS) technology, silicon-on-insulator (SOI) technology, silicon-on-nothing, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of reverse mode non-volatile memory cells that have band engineered gate-stacks and nano-crystal charge trapping in EEPROM and block erasable memory devices, such as Flash memory devices. Embodiments of the present invention allow a reverse mode gate-insulator stack memory cell that utilizes the control gate for programming and erasure through a band engineered crested tunnel barrier. Charge retention is enhanced by utilization of high work function nano-crystals in a non-conductive trapping layer and a high K dielectric charge blocking layer. The band-gap engineered gate-stack with symmetric or asymmetric crested barrier tunnel layers of the non-volatile memory cells of embodiments of the present invention allow for low voltage tunneling programming and erase with electrons and holes, while maintaining high charge blocking barriers and deep carrier trapping sites for good charge retention. The direct tunneling program and erase capability reduces damage to the gate-stack and the crystal lattice from high energy carriers, reducing write fatigue and leakage issues and enhancing device lifespan, while allowing for memory cells that can take advantage of progressive lithographic and feature size scaling. Memory cell embodiments of the present invention also allow multiple levels of bit storage in a single memory cell through incorporation of multiple trapped charge centroids and/or multiple threshold voltage levels.

In normal mode SONOS or floating gate devices, the silicon substrate is active as the source of electrons and holes during programming and erase operations. In contrast, the gate electrode serves as the source of electrons and holes during program and erase for the reverse mode device. In the case of the normal mode device, during program/erase cycling injected hot carriers adversely affect the integrity of the silicon/insulator interface as well as that of the tunnel insulator itself. Consequently, device transconductance is degraded and endurance, retention and device reliability are reduced. Reverse mode devices are immune to such adverse effects since the channel silicon/insulator interface is relatively passive during programming and erase operations, when charge injection/extraction is occurring at the control gate. Reverse mode devices, therefore, provide higher reliability, enhanced endurance, and other associated beneficial device characteristics.

Figure 1:
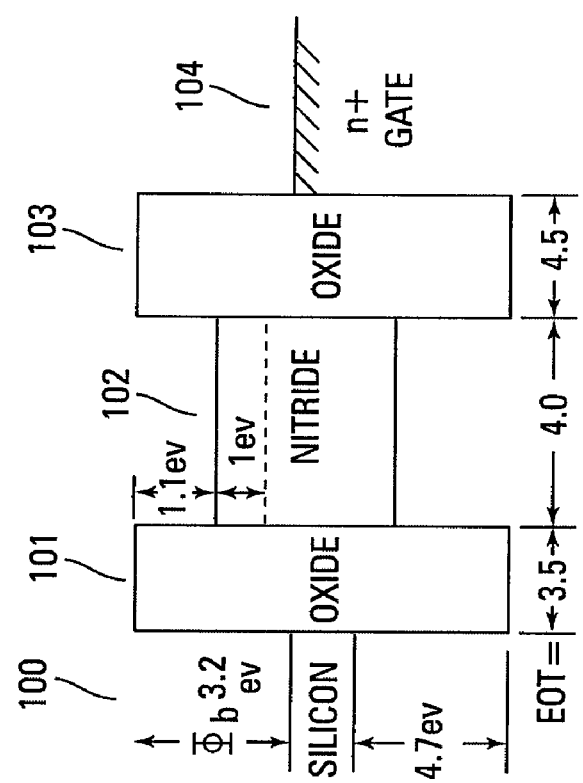
FIG. 1 shows an energy band diagram of a typical prior art SONOS structure.

FIG. 1 illustrates an energy band diagram of typical prior art silicon-oxide-nitride-oxide layers of a SONOS structure at flatbands. Flatband conditions exist when no charge is present in the semiconductor so that the silicon energy band is flat. It is assumed that this occurs at zero gate bias (neglecting the work-function difference between the gate electrode and silicon).

The illustrated structure is comprised of the silicon substrate 100, the oxide-nitride-oxide 101, 102, 103 (ONO) layer, and the control gate 104. The illustrated structure has an effective oxide thickness (EOT) of 12 nm since the tunnel oxide has an EOT of 3.5 nm, the nitride trap 102 has an EOT of 4.0 nm (physical thickness approximately 7.5 nm), and the charge blocking oxide 103 has an EOT of 4.5 nm.

SONOS and nano-crystal types of non-volatile memory devices are typically referred to as discrete trap or embedded trap devices. The charge to be stored in the trap layer 102 tunnels through the tunnel insulator 101 and is confined there in trapping sites in the trapping layer itself or in traps associated with nano-crystals due to the charge blocking insulator layer 103. This charge trapping gate stack, with its electrically isolated trapping layer, allows charge to be trapped near the channel region and affect the threshold voltage level of the non-volatile memory cell. The tunneling may be accomplished by direct and Fowler-Nordheim tunneling during write operations while holes tunnel by direct tunneling during erase operations. The trap layer 102 may be nitride for SONOS or nano-crystals (silicon, germanium, or metal embedded oxides).

Stored charge retention and erase speed sensitivity can depend on the tunneling distance (i.e., tunnel insulator thickness). For example, an increase in oxide insulator thickness from an EOT of 1 nm to 3 nm would result in a charge retention increase of approximately five orders of magnitude but also reducing the erase speed by nearly the same amount. This is due to the fact that both the back-tunneling electron current as well as the forward hole current are dependent on tunneling distance that in turn depends on the insulator thickness, given the large band energy barriers ($E_b$) of oxide of 3.2 eV for electrons and 4.7 eV for holes (with reference to silicon), respectively. The tunnel oxide 101 has an $E_b$ of approximately 9 eV, the nitride layer 102 has an $E_b$ of approximately 5.1 eV, and the charge blocking oxide has an $E_b$ of approximately 9 eV.

The band diagram of FIG. 1 also shows that the Schottky barrier height for electrons ($\Phi_b$) is 3.2 eV. $\Phi_b$ is the tunneling barrier for electrical conduction across the interface and, therefore, is of importance to the successful operation of any semiconductor device. The magnitude of $\Phi_b$ reflects the mismatch in the energy position of the majority carrier band edge of the silicon substrate 100 and the oxide tunnel insulator 101.

FIG. 2 illustrates an energy band diagram of the embodiment of FIG. 1 that is under a bias condition of V on the gate 204. Under the applied bias, the silicon-oxide interface barrier height, $\Phi_b$, does not change but the tunneling distance is reduced as shown 203 for an oxide thickness of 3.5 nm (EOT=3.5 nm).

While SONOS or nano-crystal embedded trap memory cell devices show promise in voltage scalability for non-volatile memory applications, as well as somewhat higher programming speed/endurance when compared to floating gate devices, these devices still exhibit characteristically small values of logic window (Vt1-Vt0), have limited speed and reliability, and exhibit tunnel oxide degradation similar to floating gate devices. This limits their application and potential and scalability in non-volatile memory. This is primarily due to the fact that the oxide thickness is required to be greater than 4 nm in order to meet a 10 year retention requirement and that therefore a high field is still required to transport charges through the tunnel oxide.

As such, issues with prior art floating gate, SONOS and embedded trap non-volatile memory cells include, high programming voltage and power requirements, limited programming and erasure speed, limited device scalability (without adversely affecting retention), and limited device endurance due to lattice damage from high energy carriers during programming and erasure.

In embodiments of the present invention, the gate stack of the non-volatile memory cell comprises a charge blocking dielectric layer, a trapping layer, a band engineered crested barrier tunnel layer, and a control gate forming a reverse mode memory cell field effect transistor (FET) device. The channel region is formed between two source/drain regions, the charge blocking dielectric layer is formed over the channel, followed in turn by the trapping layer, the band engineered crested barrier tunnel layer, and the control gate. In this reverse mode memory cell FET, charge storage and programming (writing and erasing) is accomplished through the control gate to the trapping layer instead of from the channel (as in a normal mode non-volatile memory cell), allowing the channel/charge blocking interface to remain relatively unaffected by programming and erasure operations, increasing device endurance. The charge blocking region is formed of a dielectric insulator material, which preferably is a high K dielectric so as to allow for reduction in overall stack EOT, and provides a high energy barrier and physical thickness to prevent electron and hole tunneling to the channel and aid in charge retention. The trapping layer is formed of trap-free high-K dielectric with high work function nano-crystals formed near the trapping layer/charge blocking layer interface, allowing a maximum electrostatic effect by the trapped charge on the channel for a large logic window, while presenting a large physical tunnel distance and barrier energy to the trapped charge prevent back-tunneling. In alternative embodiment, the trapping layer is formed of bulk trap dielectric which may or may not have nano-crystals formed near the trapping layer/charge blocking layer interface.

The tunnel layer in embodiments of the present invention comprises successive layers of tunnel insulation of differing physical thicknesses and electron and hole tunnel barrier heights formed in a band-engineered crested barrier tunnel layer. In band-engineered crested barrier tunnel layers, the successive layers of tunnel insulation materials are chosen such that a thin layer of high energy barrier material is combined with one or more lower barrier layers so that both an energy barrier and a physical thickness are present to prevent carrier tunneling. Under an applied field, the barriers of this crested tunnel layer distort to allow for low voltage carrier tunneling through the tunnel layer at high carrier fluence through the combined effects of barrier lowering and thinning. This crested barrier tunnel layer, in combination with the low EOT gate-insulator stack allows for high speed, low voltage programming/erasure of the memory cell. In one embodiment of the present invention, the tunnel barrier presents a symmetric barrier to both electron and hole tunneling. In another embodiment of the present invention, the tunnel barrier presents an asymmetric barrier to electron and hole tunneling, allowing for faster or slower programming or erasure. Band-engineered high K dielectric layers also provide enhanced programming speed at reduced field and carrier energy across the gate insulator dielectric stack, enhancing endurance and reliability. The control gate can be formed of aluminum, tungsten, polysilicon or other conductor material and is typically coupled to a word line or control line.

Figure 3A:
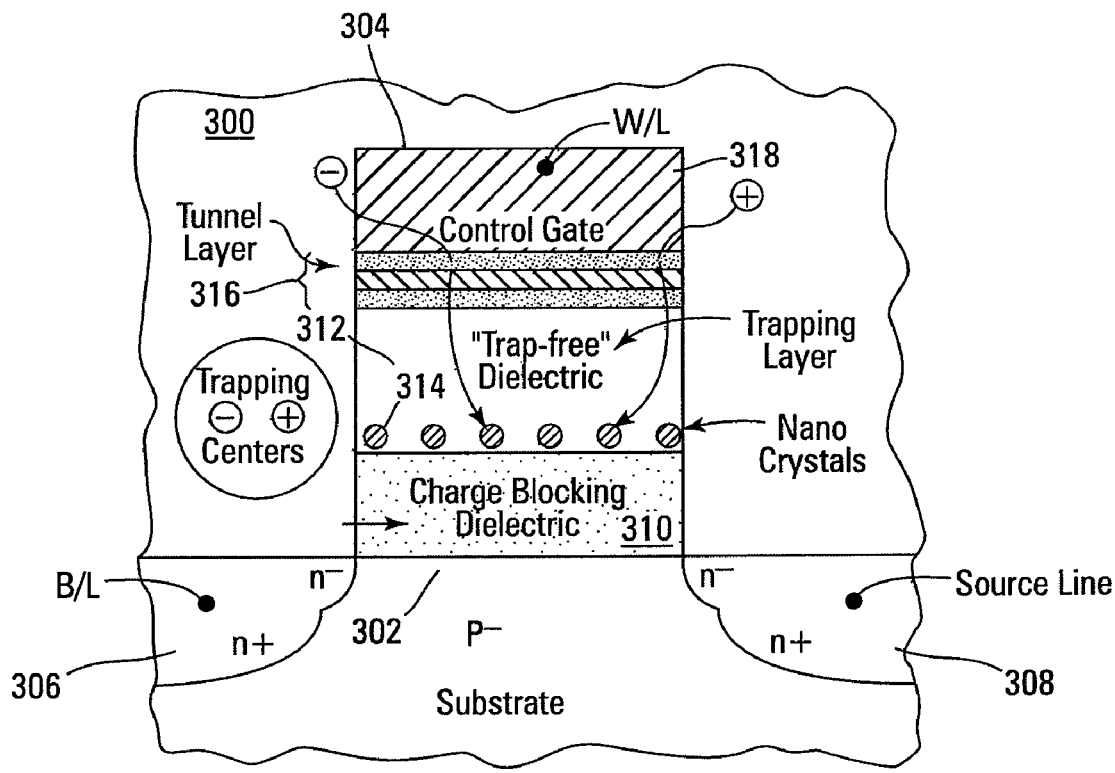
FIGS. 3A-3D shows a memory cell and band diagrams of an embodiment of the present invention.

FIG. 3A details a schematic cross section of a reverse-mode nano-crystal device 300 of an embodiment of the present invention. The gate-insulator stack 304 of the non-volatile memory cell 300 comprises a charge blocking dielectric layer 310, a trapping layer 312 with nano-crystals 314 that are placed near the trapping layer/charge blocking layer interface, a band engineered crested barrier tunnel layer 316 having two or more sub-layers, and a control gate 318 forming a reverse mode memory cell field effect transistor (FET) device. The gate-insulator stack 304 of the non-volatile memory cell 300 is formed over a channel region 302 in a substrate between two source/drain regions 306, 308, the charge blocking dielectric layer 310 is formed over the channel 302, followed in turn by the trapping layer 312, the band engineered crested barrier tunnel layer 316, and the control gate 318. In this reverse mode memory cell FET, charge storage and programming (writing and erasing) is accomplished from the control gate 318 through the crested tunnel layer 316 to the trapping layer 312, allowing the channel/charge blocking interface to remain relatively unaffected by programming and erasure operations, increasing device endurance and reliability.

Figure 3B:
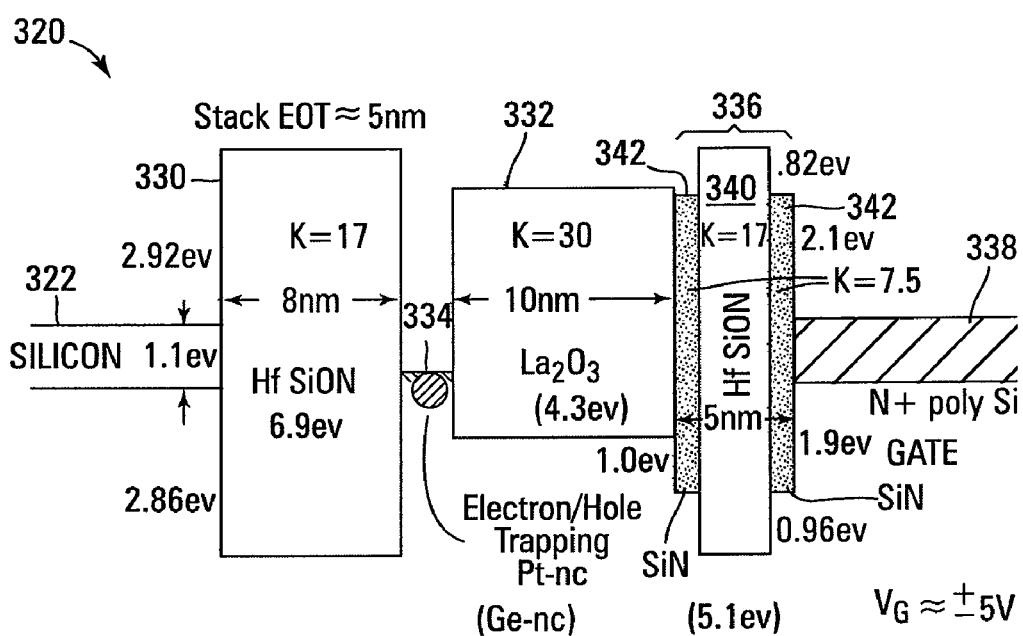

FIG. 3B details a flat band energy diagram 320 of one embodiment of the present invention. In FIG. 3B, the charge blocking layer 330 consists of a 6 nm to 10 nm layer of HfSiON (K=17, band gap of 6.9 eV) formed over a silicon substrate/channel 322. A trapping layer 332 of 10 nm to 15 nm of $La_2O_3$ (K=30, bandgap of 4.3 eV) or HfAlO (K=17) is formed over the charge blocking layer 330, having 4 nm nano-crystals 334 of platinum (Pt—NC) or germanium (Ge—NC) formed near the charge blocking/trapping layer interface. A 3-layer "crested" tunnel dielectric 336 composed of a 2.5 nm layer of HfSiON 340 (band gap of 6.9 eV) sandwiched between two 1.25 nm layers of SiN 342 (band gap of 5.1 eV) is formed over the trapping layer 332. As shown in FIG. 3B, at flat band with no bias voltage applied the barrier energies of electrons and holes at the HfSiON 340 crest edge are 2.92 eV and 2.86 eV, respectively, and are approximately symmetric, allowing an approximately equal applied voltage levels and speed for both programming and erasure.

Figure 3C:
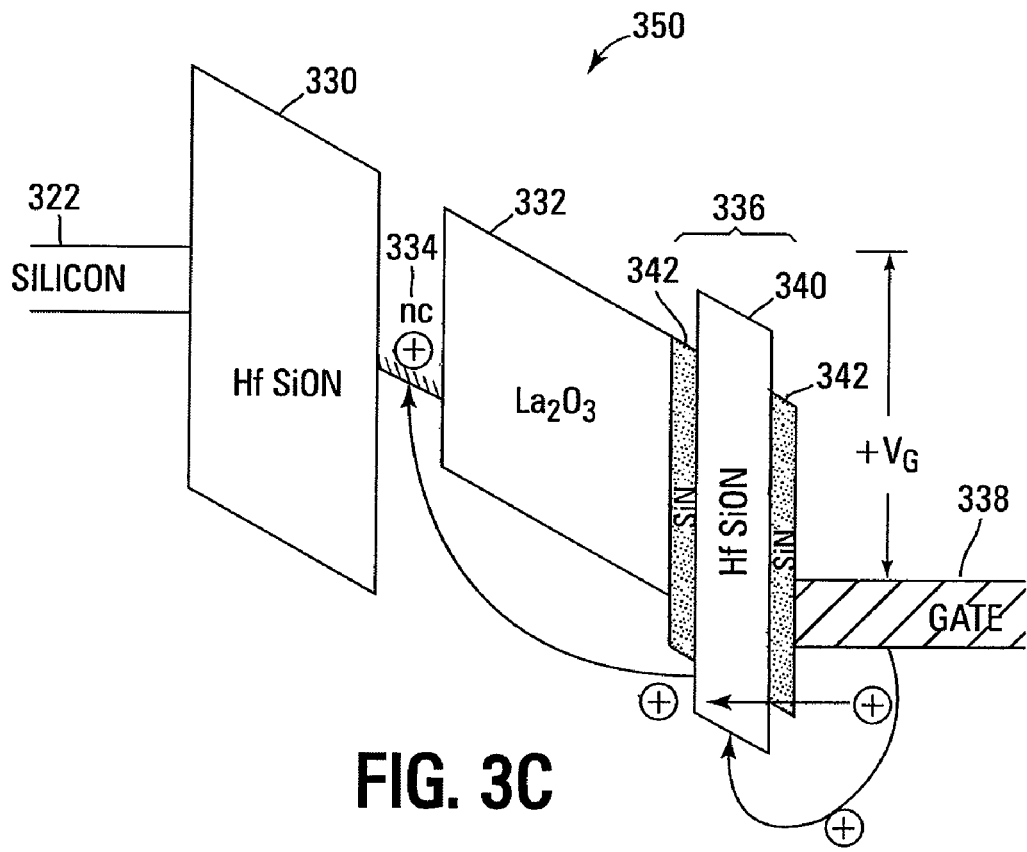
Figure 3D:
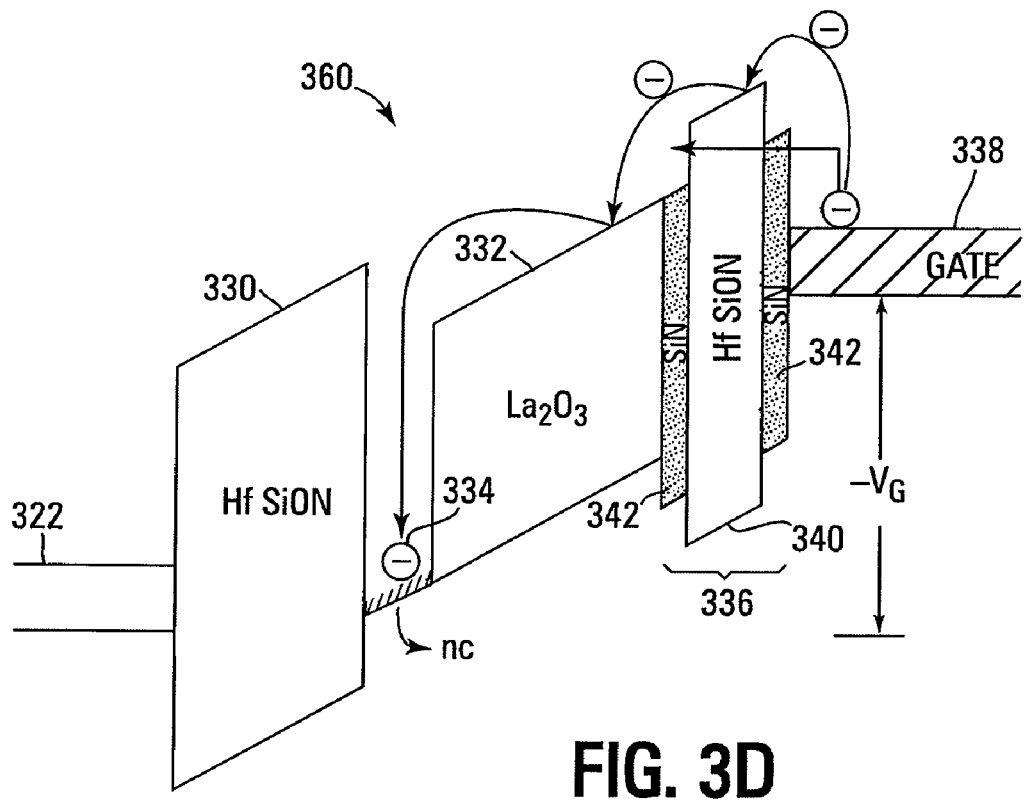

FIGS. 3C and 3D detail the energy band diagram 320 of the memory cell embodiment of FIG. 3B undergoing a programming operation 360 (FIG. 3D) and an erase operation 350 (FIG. 3C), respectively. As detailed in FIGS. 3C and 3D, when either a negative gate voltage (−Vg for programming, FIG. 3D) or a positive gate voltage (+Vg for erasure, FIG. 3C) is applied at the gate, the energy levels of the band diagram 320 are distorted. This distortion of the band diagram has the effect of lowering the effective barrier energies of the tunnel barrier, while, at the same time, the carriers gain energy, allowing them to overcome the lower energy barrier sub-layers of the crested tunnel barrier dielectric 336. In addition, the applied gate voltage distorts the tunnel dielectric's barrier energy "crest", lowering the effective tunnel distance and enabling low energy tunneling through it. As both the effective barrier energies (for electrons and holes) as well as the effective tunnel distances are reduced and electron injection 360 or hole injection 350 occurs. It is noted that because of the crested barrier tunnel layer 336 and its barrier lowering and distortion under bias, this injection of carriers (both electrons and holes) from the control gate are enhanced by many orders of magnitude over that of a conventional SONOS or embedded trap non-volatile memory cell.

In FIGS. 3C and 3D, once injected, the carriers get transported through the high K $La_2O_3$ trapping dielectric 332, which is relatively trap free, aided by the drift field across the layer. The carriers then get trapped at the $La_2O_3$/HfSiON interface where they are close to the silicon/insulator interface by the virtual ground state of the nano-crystal trapping centers 334, which preferably have a high potential well work function and a high placement density.

The high energy barriers for electrons and holes provided by the HfSiON charge blocking layer 330 and the crested barrier tunnel layer 336, combined with the deep potential wells of the high work function nano-crystals 334 helps prevent trapped-charge leakage to either the substrate or control gate 318, enhancing charge retention. The close proximity of the trapped charges stored in the nano-crystals 334 to the silicon/insulator interface of the channel 322, combined with the high density of trapping centers, result in large shift in device threshold and a resulting large logic window.

The effective tunnel barrier 336 during programming or erasure of the embodiment of the present invention detailed in FIGS. 3B-3D is around ~2 ev, as compared to the energy barriers of 3.2 ev and 4.7 ev for electrons and hole, respectively, for a $SiO_2$ tunnel dielectric in a conventional device. This lowers the required programming voltages and power requirements of the resulting non-volatile memory cells. The tunnel distance of the barrier is also reduced by the crested barrier design of the embodiment, thinning the tunnel distances and enhancing the electron and hole carrier fluence by 6 to 8 orders of magnitude over that of a conventional SONOS device. As a result, the programming and erasure speeds of memory cells of the present invention are both enhanced by similar orders of magnitude.

The device detailed in FIGS. 3B-3D has a total physical gate insulator stack thickness of less than 25 nm and yet has an overall EOT of approximately 5 nm due to the higher K value materials utilized in the gate-insulator stack layers. The tunnel layer 336 has an EOT of ~1.87 nm, which is approximately a third of the total stack EOT. The tunnel layer 336 therefore has a correspondingly initial applied voltage drop of the same proportion. The average peak field across the tunnel layer 336 during a +/−5V programming or erase operation is less than or equal to 3.8 MV/cm, as compared to greater than 10 MV/cm field for a conventional $SiO_2$ tunnel dielectric. This lower peak field results in a significant improvement in device power consumption, speed, endurance and reliability. Furthermore, due to the barrier energy symmetry, the write speed (electron injection) and the erase speed (hole injection) are approximately the same. Whereas in $SiO_2$ the erase speed is significantly slower than programming speed due to $SiO_2$ having a higher barrier energy for holes than electrons. Charge tunneling to and from silicon substrate is also prevented during programming/erasure due to the high barriers (of ~3 eV) of the HfSiON charge blocking layer 330, the silicon substrate/HfSiON charge blocking layer 330 interface and channel 322 remain relatively undamaged during the device lifetime. Device transconductance is thus preserved and leakage paths are not generated in the HfSiON charge blocking layer 330. The use of direct tunneling and/or low voltage Enhanced Fowler-Nordheim tunneling for programming/erasure in embodiments of the present invention, combined with low leakage, provide significant operational power reductions. The expected device characteristics for the embodiment detailed in FIGS. 3B-3D are: Programming Voltage: +/−5 Volts, Programming Speed<1 µsec for either write or erase, End-of-life Threshold Window: >2 Volts, Endurance>>1E10 cycles, and Retention>>10 years.

Figure 4:
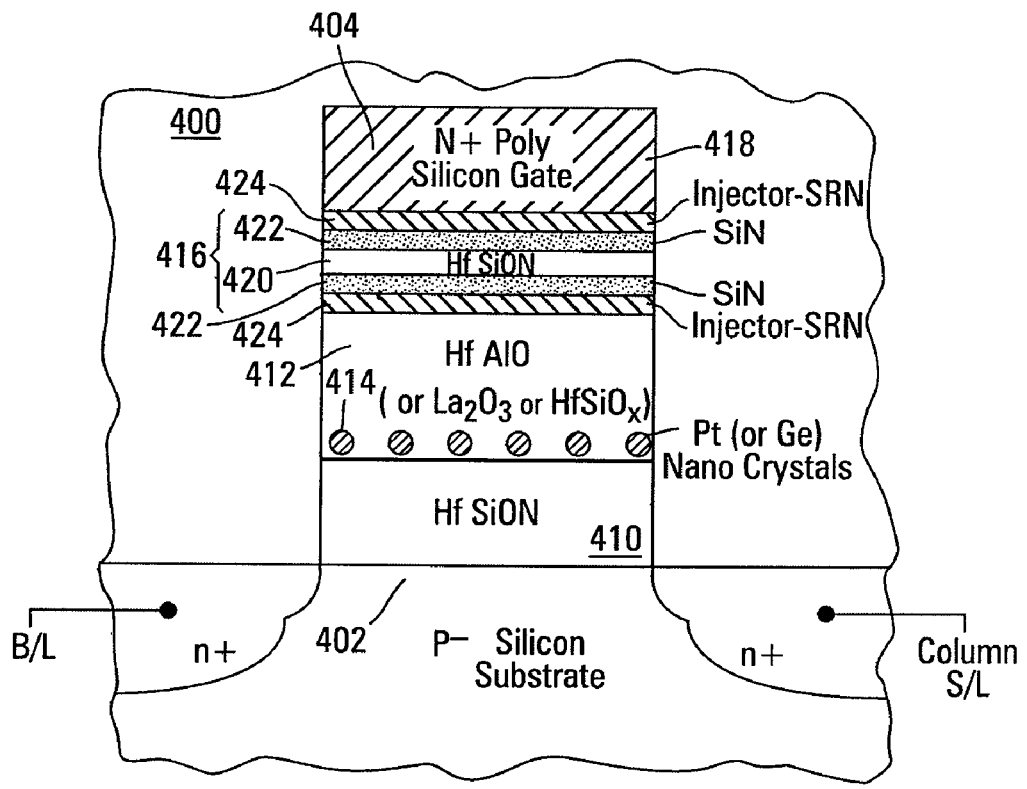
FIG. 4 shows a memory cell of another embodiment of the present invention.

FIG. 4 details a non-volatile memory cell of another embodiment of the present invention having similar characteristics to the memory cell of FIGS. 3B-3D that utilizes Hf-oxide based family of insulators. In FIG. 4, the gate-insulator stack 404 consists of a HfSiON charge blocking layer 410, HfAlO (Hafnium-Aluminum Oxide) or $HfSiO_x$ (Hf-silicate) trapping layer 412 having high work function nano-crystals 414, such as, but not limited to, platinum nano-crystals (Pt-nc) or germanium nano-crystals (Ge-nc), and a crested barrier tunnel layer 416 of layered SiN/HfSiON/SiN insulator material. In addition, in FIG. 4, an injector silicon-rich nitride layer (I-SRN) 424 may optionally be incorporated between the gate 418 and the tunnel layers 420, 422. The I-SRN layer 424 locally enhances the field across the tunnel layer 416 and further enhances charge injection and device speed, enabling additional voltage scaling. An additional I-SRN layer can also be included at the tunnel layer/trapping layer interface. It is noted that that other higher K dielectric materials could be used as the trapping layer dielectric 412 in embodiments of the present invention, instead of, for example, $La_2O_3$ (K=30, bandgap: 4.3 eV) to achieve similar device characteristics. Such materials include, but not limited to, HfAlO (K=17), $HfSiO_x$ (K=20), HfSiON (K=17, band gap of 6.9 eV), and $LaAlO_3$ (K=27.5, bandgap=6.5 eV).

Figure 5:
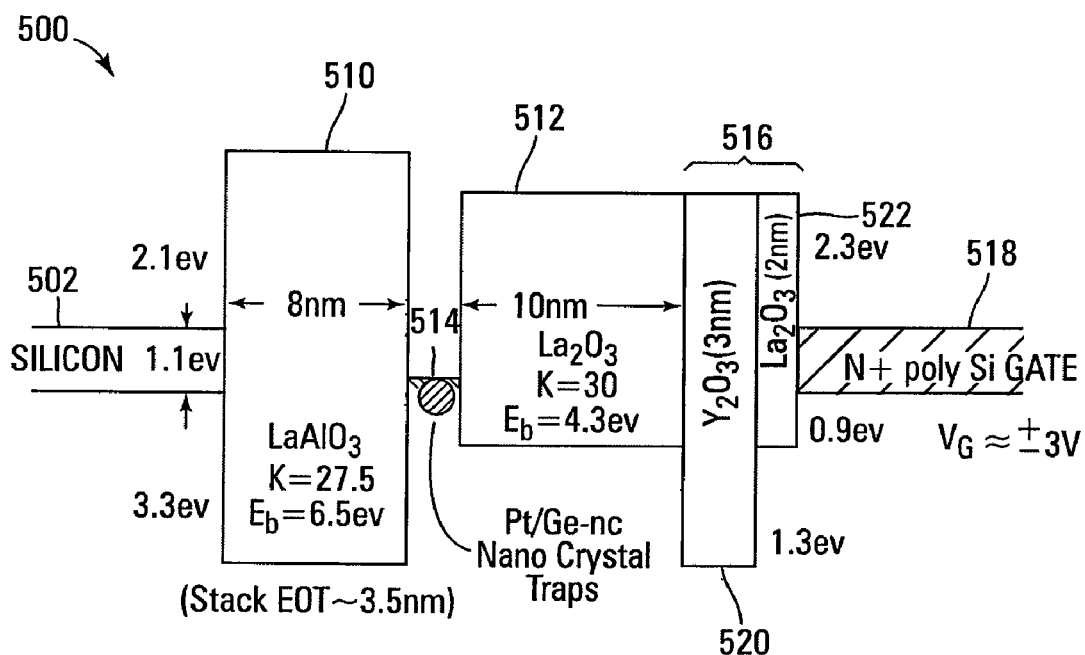
FIG. 5 shows a memory cell band diagram of yet another embodiment of the present invention.

FIG. 5 details a flat band energy diagram of a primarily Lanthanum-oxide family based non-volatile memory cell of yet another embodiment of the present invention designed to achieve additional voltage scaling. In FIG. 5, a gate-insulator stack having a crested barrier tunnel layer 516 that is designed for hole injection for yet additional erase speed improvement consists of a combination of 3 nm of $Y_2O_3$ (band gap: 5.6 eV, K=15) 520 and 2 nm of $La_2O_3$ (band gap: 4.3 eV, K=30) 522. The trapping layer/nano-crystal dielectric medium 512 is also of 10 nm of $La_2O_3$. The charge blocking layer 510 comprises 8 nm of $LaAlO_3$ formed over a silicon substrate/channel 502. High work function nano-crystals 514 are embedded at the interface of the charge blocking layer 510 and the trapping layer 512. Due to the higher K values of the dielectric layers selected, for the same physical thickness of layers as shown in FIGS. 3B-3D, the EOT of the insulator stack of FIG. 5 is around 3.5 nm, allowing the programming and erase voltage to be reduced to +/−3V while achieving similar device characteristics to the memory cell embodiment of FIGS. 3B-3D. In addition, as stated above, the lower effective barrier for hole injection also further enhances erase speed in the embodiment of FIG. 5.

For charge blocking layers of embodiments of the present invention, due to lack of having to tunnel carriers through it for programming or erasure, the primary characteristics required for charge blocking layer is to provide a high enough barrier to electron or hole tunneling while forming a saturated (no dangling bond) clean interface having a very low density of states with the channel/silicon substrate. In order to effectively prevent electron or hole tunneling, the barrier energy for both should be greater than 2.5 eV and physical thicknesses greater than or equal to 5 nm to prevent such injection during programming or erasure. Although $SiO_2$ fulfills most of the above-mentioned requirements, it has a low K value (K=3.9) and higher K insulators are desired for voltage scaling and the reduction of fixed charge formation at the interface. Examples of such higher K dielectric materials include, but are not limited to HfSiON (K=17), HfAlO (K=17), $La_2O_3$ (K=30, bandgap of 4.3 eV), $LaAlO_3$ (K=27.5, band gap: 6.5 eV), $SiO_xC_y$ (Silicon-oxy-carbide: K=7, band gap: 6.3 eV), and $HfSiO_x$ (Hafnium silicate: K=20, band gap 4.7 eV).

In yet another embodiment of the present invention, the charge blocking layer consists of 5 nm or more of a high barrier, high K dielectric material, a high density of platinum nano-crystals (with a density greater than or equal to 5E12/cm2) embedded in a trapping layer of 5 nm-7 nm of $Ta_2O_5$ and a crested barrier tunnel layer. The crested barrier tunnel layer formed of a 2 nm layer of $Ta_2O_5$ (K=26, band gap: 4.5 eV) formed over the 5 nm-7 nm nano-crystal embedded layer, a 10 nm-15 nm layer of $La_2O_3$ (K=30, bandgap of 4.3 eV) and a thin overlayer of injector silicon-rich-nitride (I-SRN).

It is also noted that many combinations of dielectric layers to form crested barriers are possible. In particular, those combining multiple high K layers. It should be noted however, for balancing retention with programming speed, the peak barrier height at flat band should be in the order of ~2 ev both for electrons and holes to avoid charge loss and retention issues through the tunnel layer, thereby limiting the selection of dielectric layers for tunneling medium. For example, layers of $HfO_2$ (K=24, band gap: 5.7 eV), $TiO_2$ (K=80, band gap: 3.5 eV), $Ta_2O_5$ (K=26, band gap: 4.5 eV) can be combined with other layers such as SiN, $Y_2O_3$, or etc. to enhance electron injection, but such combination would compromise retention. It should also be noted that tunneling layers should preferably be those with reduced intrinsic trap density unless selected to be extremely thin (direct tunneling).

It is noted that in embodiments of the present invention, trapping dielectric is preferred to be a high K dielectric with reduced trap density and that charge trapping occur mainly at the nano-crystal locations to promote well defined device characteristics. However, other high K trapping dielectrics may also be considered such as, but not limited to, $TiO_2$ (K=80), $Ta_2O_5$ (K=26), and MN (K=10).

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each non-volatile memory cell of the array matrix are coupled by rows to word select lines (word lines) and their drains are coupled to column bit lines. The source of each non-volatile memory cell is typically coupled to a common source line. The NOR architecture non-volatile memory array is accessed by a row decoder activating a row of non-volatile memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory. It is noted that other memory arrays incorporating memory cell embodiments of the present invention are possible, including but not limited to AND memory arrays and virtual ground memory arrays, and will be apparent to those skilled in the art with the benefit of the present disclosure.

An EEPROM or Flash NAND array architecture also arranges its array of non-volatile memory cells in a matrix such that the gates of each non-volatile memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of non-volatile memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current or voltage encoded stored data values of the row of selected memory cells on the column bit lines. A column page of bit lines is selected and sensed, and then individual data words are selected from the sensed data words from the column page and communicated from the memory device.

Figure 6A:
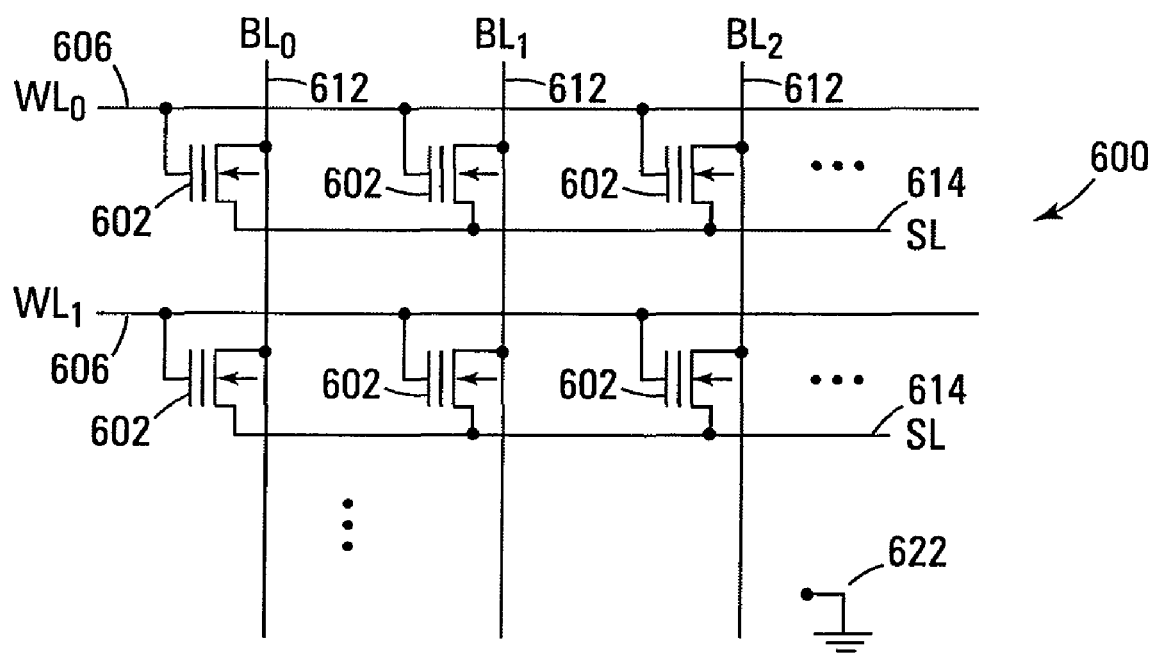
FIGS. 6A and 6B detail NOR and NAND architecture memory arrays in accordance with embodiments of the present invention.

FIG. 6A shows a simplified NOR non-volatile memory array 600 of a EEPROM or Flash memory device of an embodiment of the present invention. In FIG. 6A, a NOR array 600 couples non-volatile memory cells 602 of embodiments of the present invention to bit lines 612, source lines 614, word lines 606, and a substrate connection 222. In forming the NOR array 600, the bit lines 612 and source lines 614 are typically coupled to N+ or P+ doped source/drain regions deposited in the substrate and separated by a channel region. Each memory cell FET 602 has a gate-insulator stack formed over the channel region and between the source/drain regions of a bit line 612 and a source line 614, utilizing the regions as a drain and source respectively (it is noted that the source line 614 may be replaced with a second bit line 612 connection in virtual ground or multi-bit cell arrays, so that the current flow through the memory cell may be reversed). As described above, the gate-insulator stack is made of a charge blocking layer formed over the channel region, a trapping layer with embedded nano-crystals formed on the charge blocking layer, a composite band-gap engineered crested barrier tunnel layer formed on top of the trapping layer, and a control gate 606 (typically formed integral to the word line 606, also known as a control gate line) formed over the tunnel layer. It is noted that other NOR architecture memory array 600 configurations incorporating embodiments of the present invention are possible and will be apparent to those skilled in the art with the benefit of the present disclosure.

Figure 6B:
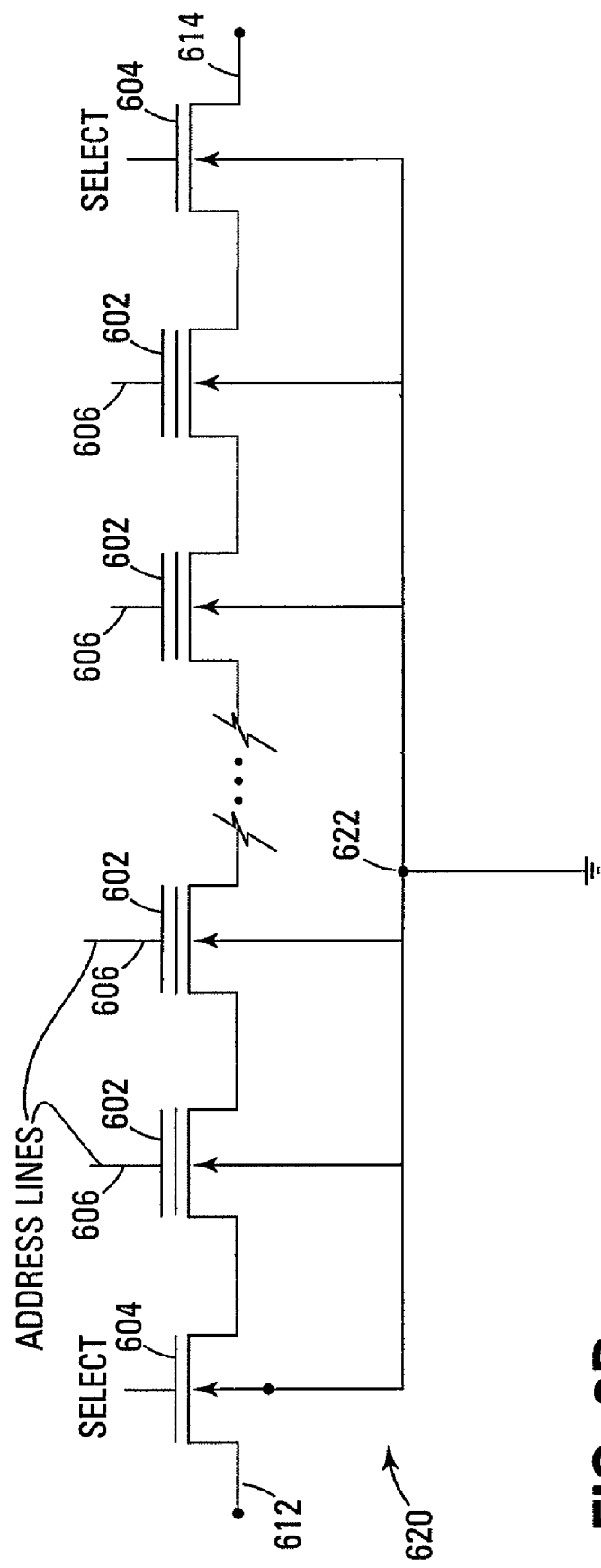

FIG. 6B details a simplified NAND memory string 620 of a NAND architecture EEPROM or Flash memory device of an embodiment of the present invention. In FIG. 6B, a series of non-volatile memory cells 602 of embodiments of the present invention are coupled together source to drain to form a NAND string 620 (typically of 8, 16, 32, or more cells). Each memory cell FET 602 has a gate-insulator stack made of a charge blocking layer formed over the channel region, a trapping layer with embedded nano-crystals formed on the charge blocking layer, a composite band-gap engineered crested barrier tunnel layer formed on top of the trapping layer, and a control gate 606 (typically formed integral to the word line 606, also known as a control gate line) formed over the tunnel layer. N+ or P+ doped regions are formed between each gate insulator stack to form the source and drain regions of the adjacent non-volatile memory cells, which additionally operate as connectors to couple the cells of the NAND string 620 together. Optional select gates 604, that are coupled to gate select lines, are formed at either end of the NAND non-volatile memory cell string 620 and selectively couple opposite ends of the NAND non-volatile memory cell string 620 to a bit line 612 and a source line 614. In a NAND memory array, the NAND architecture memory string 620 of FIG. 6B would be coupled to bit lines 612, source lines 614, word lines 606, and a substrate connection 622.

Figure 7:
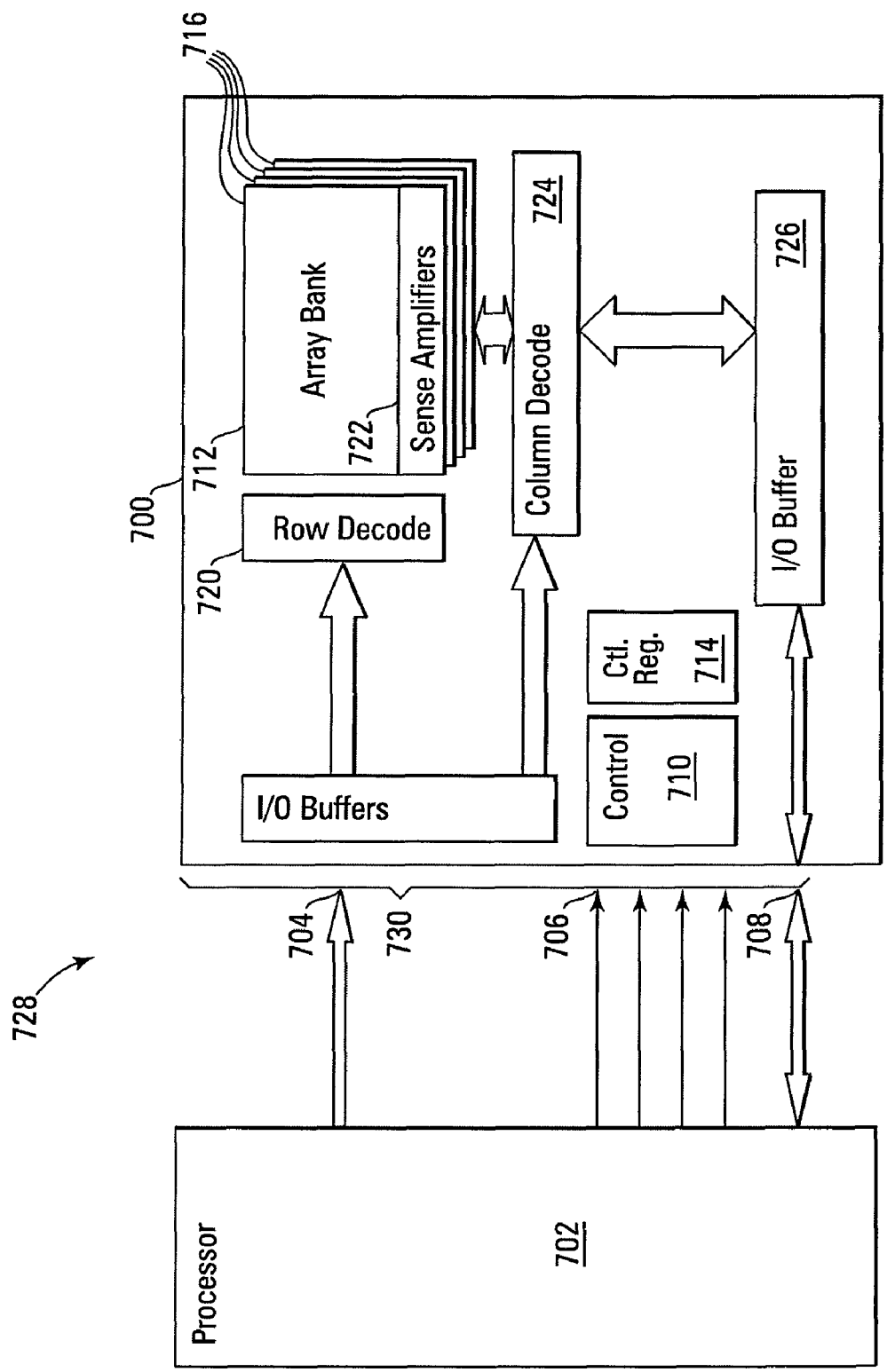
FIG. 7 details a system with a memory device in accordance with embodiments of the present invention.

FIG. 7 shows a simplified diagram of a system 728 incorporating a non-volatile memory device 700 of the present invention coupled to a host 702, which is typically a processing device or memory controller. In one embodiment of the present invention, the non-volatile memory 700 is a NOR architecture Flash memory device or a NAND architecture Flash memory device. The non-volatile memory device 700 has an interface 730 that contains an address interface 704, control interface 706, and data interface 708 that are each coupled to the processing device 702 to allow memory read and write accesses. It is noted that other memory interfaces 730 that can be utilized with embodiments of the present invention exist, such as a combined address/data bus, and will be apparent to those skilled in the art with the benefit of the present disclosure. In one embodiment of the present invention, the interface 730 is a synchronous memory interface, such as a SDRAM or DDR-SDRAM interface. Internal to the non-volatile memory device, an internal memory controller 710 directs the internal operation; managing the non-volatile memory array 712 and updating RAM control registers and non-volatile erase block management registers 714. The RAM control registers and tables 714 are utilized by the internal memory controller 710 during operation of the non-volatile memory device 700. The non-volatile memory array 712 contains a sequence of memory banks or segments 716. Each bank 716 is organized logically into a series of erase blocks (not shown). Memory access addresses are received on the address interface 704 of the non-volatile memory device 700 and divided into a row and column address portions.

On a read access the row address is latched and decoded by row decode circuit 720, which selects and activates a row/page (not shown) of memory cells across a selected memory bank. The bit values encoded in the output of the selected row of memory cells are coupled to a local bit line (not shown) and a global bit line (not shown) and are detected by sense amplifiers 722 associated with the memory bank. The column address of the access is latched and decoded by the column decode circuit 724. The output of the column decode circuit 724 selects the desired column data from the internal data bus (not shown) that is coupled to the outputs of the individual read sense amplifiers 722 and couples them to an I/O buffer 726 for transfer from the memory device 700 through the data interface 708.

On a write access the row decode circuit 720 selects the row page and column decode circuit 724 selects write sense amplifiers 722. Data values to be written are coupled from the I/O buffer 726 via the internal data bus to the write sense amplifiers 722 selected by the column decode circuit 724 and written to the selected non-volatile memory cells (not shown) of the memory array 712. The written cells are then reselected by the row and column decode circuits 720, 724 and sense amplifiers 722 so that they can be read to verify that the correct values have been programmed into the selected memory cells.

Figure 8:
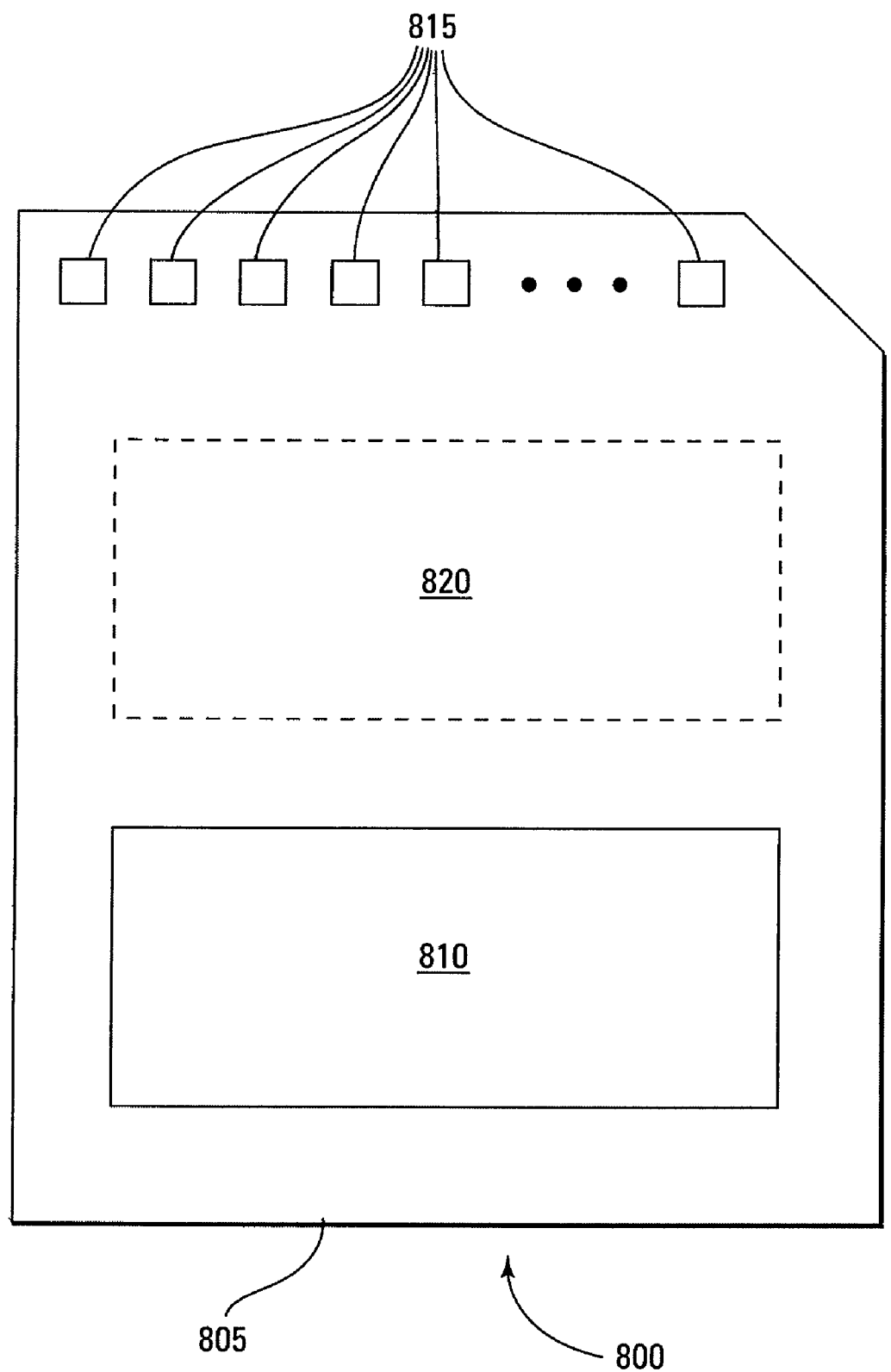
FIG. 8 details a memory module in accordance with embodiments of the present invention.

FIG. 8 is an illustration of an exemplary memory module 800. Memory module 800 is illustrated as a memory card, although the concepts discussed with reference to memory module 800 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory including memory cell circuits of or adapted to perform methods of the present invention. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820 which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of I/O connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC (application specific integrated circuit). Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

It is noted that other memory cells, memory strings, arrays, and memory devices in accordance with embodiments of the present invention are possible and should be apparent to those skilled in the art with benefit of the present disclosure.

CONCLUSION

Non-volatile memory devices and arrays have been described that utilize reverse mode non-volatile memory cells that have band engineered gate-stacks and nano-crystal charge trapping in EEPROM and block erasable memory devices, such as Flash memory devices. Embodiments of the present invention allow a reverse mode gate-insulator stack memory cell that utilizes the control gate for programming and erasure through a band engineered crested tunnel barrier. Charge retention is enhanced by utilization of high work function nano-crystals in a non-conductive trapping layer and a high K dielectric charge blocking layer. The band-gap engineered gate-stack with symmetric or asymmetric crested barrier tunnel layers of the non-volatile memory cells of embodiments of the present invention allow for low voltage tunneling programming and erase with electrons and holes, while maintaining high charge blocking barriers and deep carrier trapping sites for good charge retention. The direct tunneling program and erase capability reduces damage to the gate-stack and the crystal lattice from high energy carriers, reducing write fatigue and leakage issues and enhancing device lifespan, while allowing for memory cells that can take advantage of progressive lithographic and feature size scaling. Memory cell embodiments of the present invention also allow multiple levels of bit storage in a single memory cell through multiple charge centroids and/or multiple threshold voltage levels.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A reverse mode non-volatile memory cell, comprising:
   first and second source/drain regions formed in a substrate coupled by a channel region;
   a charge blocking layer formed over the channel region;
   a trapping layer formed over the charge blocking layer, wherein the trapping layer is a dielectric containing a plurality of bulk trapping sites;
   a crested barrier tunnel insulator layer containing two or more sub-layers formed over the trapping layer; and
   a control gate formed over the crested barrier tunnel layer.

2. The reverse mode non-volatile memory cell of claim 1, wherein the trapping layer contains a plurality of nano-crystals embedded in the trapping layer near the charge blocking layer.

3. The reverse mode non-volatile memory cell of claim 2, wherein the plurality of nano-crystals are deep potential well/high work function nano-crystals.

4. The reverse mode non-volatile memory cell of claim 2, wherein the plurality of nano-crystals is one of platinum and germanium nano-crystals.

5. The reverse mode non-volatile memory cell of claim 2, wherein the embedded nano-crystal trapping layer is one of HfSiON (Hafnium Silicon-Oxy-Nitride), HfAlO (Hafnium Aluminate), LaAlO$_3$ (Lanthanum Aluminate), HfSiO$_x$ (Hafnium silicate), and La$_2$O$_3$ (Lanthanum Oxide).

6. The reverse mode non-volatile memory cell of claim 1, wherein the two or more sub-layers of the crested barrier tunnel insulator layer comprise two or more sub-layers of dielectric material, where each sub-layer has a barrier height greater than or equal to 2 eV to both electrons and holes and where at least one sub-layer has a barrier height greater than 2 eV for electrons and/or holes.

7. The reverse mode non-volatile memory cell of claim 1, wherein an overall thickness of the crested barrier tunnel insulator layer is greater than or equal to 5 nm.

8. The reverse mode non-volatile memory cell of claim 1, wherein each of the two or more sub-layers of the crested barrier tunnel insulator layer are one of HfSiON (Hafnium Silicon-Oxy-Nitride), HfAlO (Hafnium Aluminate), LaAlO$_3$ (Lanthanum Aluminate), SiO$_x$C$_y$ (Silicon-oxy-carbide), HfSiO$_x$ (Hafnium silicate), SiO$_2$ (silicon dioxide), La$_2$O$_3$ (Lanthanum Oxide), SiN (silicon nitride), Y$_2$O$_3$ (yttrium oxide), and HfO$_2$ (Hafnium Oxide).

9. The reverse mode non-volatile memory cell of claim 1, further comprising at least one layer of injector silicon-rich-nitride (I-SRN) formed adjacent the crested barrier tunnel insulator layer.

10. The reverse mode non-volatile memory cell of claim 1, further comprising at least one layer of injector silicon-rich-nitride (I-SRN) interposed between crested barrier tunnel insulator layer and the control gate and another injector silicon-rich-nitride (I-SRN) interposed between the trapping layer and the crested barrier tunnel insulator layer.

11. The reverse mode non-volatile memory cell of claim 1, wherein the charge blocking layer comprises a high K dielectric material having a barrier height greater than or equal to 2 eV to both electrons and holes.

12. The reverse mode non-volatile memory cell of claim 1, wherein an overall thickness of the charge blocking layer is greater than or equal to 5 nm.

13. The reverse mode non-volatile memory cell of claim 1, wherein the charge blocking layer is one of HfSiON (Hafnium Silicon-Oxy-Nitride), HfAlO (Hafnium Aluminate), LaAlO$_3$ (Lanthanum Aluminate), SiO$_x$C$_y$ (Silicon-oxy-carbide), HfSiO$_x$ (Hafnium silicate), SiO$_2$ (silicon dioxide), and La$_2$O$_3$ (Lanthanum Oxide).

14. A reverse mode non-volatile memory cell, comprising:
   first and second source/drain regions formed in a substrate coupled by a channel region;
   a charge blocking layer formed over the channel region;
   a trapping layer formed over the charge blocking layer, wherein the trapping layer is a dielectric containing a plurality of bulk trapping sites and wherein the plurality of bulk trapping sites comprise a plurality of nano-crystals embedded in the trapping layer;
   a crested barrier tunnel insulator layer containing two or more sub-layers formed over the trapping layer;
   an injector silicon-rich-nitride (I-SRN) formed over the crested barrier tunnel insulator layer; and
   a control gate formed over the injector silicon-rich-nitride (I-SRN).

15. The reverse mode non-volatile memory cell of claim 14, wherein the crested barrier tunnel insulator layer comprises a HfSiON (Hafnium Silicon-Oxy-Nitride) sub-layer interposed between SiN (silicon nitride) sub-layers.

16. The reverse mode non-volatile memory cell of claim 14, wherein the crested barrier tunnel insulator layer comprises a La$_2$O$_3$ (Lanthanum Oxide) sub-layer over a Y$_2$O$_3$ (yttrium oxide) sub-layer.

17. The reverse mode non-volatile memory cell of claim 14, further comprising another injector silicon-rich-nitride (I-SRN) interposed between the trapping layer and the crested barrier tunnel insulator layer.

18. A non-volatile memory device, comprising:
   a non-volatile memory array containing a plurality of reverse mode non-volatile memory cells formed into rows and columns, wherein one or more of the plurality of reverse mode non-volatile memory cells comprises:
   first and second source/drain regions formed in a substrate coupled by a channel region;
   a charge blocking layer formed over the channel region;
   a trapping layer formed over the charge blocking layer, wherein the trapping layer is a dielectric containing a plurality of bulk trapping sites;
   a crested barrier tunnel insulator layer containing two or more sub-layers formed over the trapping layer; and
   a control gate formed over the crested barrier tunnel layer.

19. The non-volatile memory device of claim 18, wherein the trapping layer contains a plurality of nano-crystals embedded in the trapping layer near the charge blocking layer.

20. The non-volatile memory device of claim 18, wherein the trapping layer is one of HfSiON (Hafnium Silicon-Oxy-Nitride), HfAlO (Hafnium Aluminate), $LaAlO_3$ (Lanthanum Aluminate), $HfSiO_x$ (Hafnium silicate), and $La_2O_3$ (Lanthanum Oxide).

21. The non-volatile memory device of claim 18, wherein the interface is a synchronous memory interface.

22. The non-volatile memory device of claim 18, wherein the plurality of non-volatile memory cells of the memory array are further arranged into one of a NOR architecture memory array and a NAND architecture memory array.

23. The reverse mode non-volatile memory cell of claim 18, further comprising at least one layer of injector silicon-rich-nitride (I-SRN) formed adjacent the crested barrier tunnel insulator layer.

* * * * *

UNITED STATES PATENT AND TRADEMARK OFFICE
CERTIFICATE OF CORRECTION

| | | |
|---|---|---|
| PATENT NO. | : 7,851,850 B2 | Page 1 of 1 |
| APPLICATION NO. | : 12/623895 | |
| DATED | : December 14, 2010 | |
| INVENTOR(S) | : Arup Bhattacharyya | |

It is certified that error appears in the above-identified patent and that said Letters Patent is hereby corrected as shown below:

In column 1, line 11, delete "U.S. Pat. No. 1,629,641, (allowed)," and insert -- U.S. Pat. No. 7,629,641, --, therefor.

Signed and Sealed this
Twenty-second Day of February, 2011

David J. Kappos
*Director of the United States Patent and Trademark Office*